(12) United States Patent
Ausserlechner

(10) Patent No.: US 8,915,153 B2
(45) Date of Patent: Dec. 23, 2014

(54) DOUBLE DIE SENSOR

(75) Inventor: Udo Ausserlechner, Villach (AT)

(73) Assignee: Infineon Technologies AG, Neubiberg (DE)

(*) Notice: Subject to any disclaimer, the term of this patent is extended or adjusted under 35 U.S.C. 154(b) by 182 days.

(21) Appl. No.: 13/421,191

(22) Filed: Mar. 15, 2012

(65) Prior Publication Data

US 2013/0239702 A1    Sep. 19, 2013

(51) Int. Cl.
 *G01L 1/00*    (2006.01)

(52) U.S. Cl.
 USPC ............................................. 73/862.68

(58) Field of Classification Search
 USPC ............................................. 73/862.68
 See application file for complete search history.

(56) References Cited

U.S. PATENT DOCUMENTS

| | | | |
|---|---|---|---|
| 3,392,349 A * | 7/1968 | Bartley | 331/65 |
| 5,994,698 A * | 11/1999 | Kawade et al. | 850/26 |
| 6,225,716 B1 | 5/2001 | Sies et al. | |
| 6,356,068 B1 | 3/2002 | Steiner et al. | |
| 8,054,071 B2 | 11/2011 | Doogue et al. | |
| 2007/0241423 A1 * | 10/2007 | Taylor et al. | 257/530 |
| 2008/0094055 A1 * | 4/2008 | Monreal et al. | 324/117 H |

OTHER PUBLICATIONS

Moisture Sensitivity Classification of Flange Mounted Packages at Texas Instruments, Sep. 2007.*

* cited by examiner

*Primary Examiner* — Lisa Caputo
*Assistant Examiner* — Brandi N Hopkins
(74) *Attorney, Agent, or Firm* — Eschweiler & Associates, LLC

(57) ABSTRACT

One embodiment of the present invention relates to a device, such as a sensor device. The device includes a sensor die and a circuit die. The sensor die includes a sensor and a feedback component. The circuit die includes circuitry. The circuit die is varied from the sensor die, such as comprising a varied substrate material. The circuitry is coupled to the sensor and the feedback component. The circuitry and the feedback component can communicate correlation information.

17 Claims, 3 Drawing Sheets

DOUBLE DIE SENSOR

BACKGROUND

Semiconductor devices are used to perform a variety of functions and tasks. Semiconductor devices include amplifiers, current devices, signal devices, communication device, memory devices and even sensor devices. Sensor based semiconductor devices can be utilized to measure current, voltage, movement, vibration, temperature, magnetic fields, and the like.

One example of a sensor device is a hall effect sensor, also referred to as a hall sensor. A hall effect sensor typically varies an output voltage in response to a magnetic field. Hall sensors are used for proximity detection, proximity switching, positioning, speed detection and current sensing applications. Hall sensors are utilized in a variety of devices. For example, hall sensors are often used by printers in order to detect missing paper.

DETAILED DESCRIPTION

Figure 1:
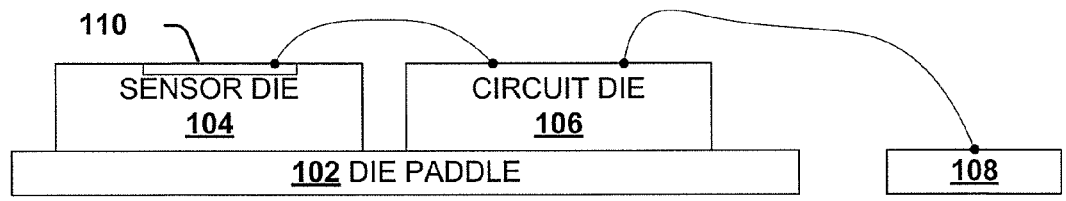
FIG. 1 is a cross sectional view illustrating a sensor based semiconductor device.

The present invention will now be described with reference to the attached drawing figures, wherein like reference numerals are used to refer to like elements throughout, and wherein the illustrated structures and devices are not necessarily drawn to scale.

The present invention includes embodiments that compensate for technology variations or spreads in multiple die packages or devices. Information related to the variations is utilized to compensate signals and the like to mitigate the impact of those variations.

FIG. 1 is a cross sectional view illustrating a sensor semiconductor device 100. The device 100 is provided for illustrative purposes and includes a die paddle 102, a sensor die 104, a circuit die 106 and a lead or bonding pad 108. The device 100 is provided and described in a simplified form to aid understanding. The sensor die 104 includes a sensor 110. The circuit die 106 includes a circuit (not shown).

A wire or lead connection is shown connecting the sensor die 104 to the circuit die 106. Additionally, a wire is shown connecting the circuit die 106 to the lead pad 108.

The circuit die 106 utilizes a semiconductor substrate comprised of silicon (Si) having a crystal structure of (100). Circuitry formed or located on the die 106 can perform functions, such as signal conditioning, and the like.

The sensor die 106 utilizes a Gallium Arsenide (GaAs) substrate and includes the sensor 110. GaAs is a compound of the elements gallium and arsenic. It is a III/V semiconductor. GaAs tends to have higher saturated electron velocity and higher electron mobility, allowing transistors formed therein to operate at higher frequencies (e.g., in excess of 250 Ghz) than silicon based devices. Further, GaAs devices are less sensitive to head and tend to have less noise, especially at higher frequencies. However, GaAs and GaAs devices formed therein are generally more costly than silicon based semiconductor devices.

The sensor 110 in this example is a hall effect sensor. The sensor 110 has a relatively better signal to noise ratio by being implemented in GaAs, when compared with silicon based hall sensors. The silicon substrate of the circuit die 106 provides a relatively low cost substrate and fabrication cost for circuitry formed thereon. This is due to the large availability of silicon. Additionally, the silicon substrate provides a proven and tested substrate material having a relatively high reliability.

However, the use of the silicon substrate for the circuit die 106 and the GaAs substrate for the sensor die 104 can be problematic. A variety of technology conditions or spreads can impact and/or alter operation of circuits formed in these substrates. Variations can occur due to fabrication processes, substrate materials, and operating conditions. However, when a single or similar substrate composition is used, the impact on devices formed therein is mitigated. However, when varied substrates are used, the impact on the devices formed can be problematic. For example, doping levels can vary slightly during fabrication, but result in larger than expected variations between the dies 104 and 106. Further, temperature effects can also result in uncorrelated variations.

Here, the sensor 110 is a GaAs hall sensor and is supplied by current generated on the circuit die 106. Technology spreads can result in the supplied current being at an improper value. For example, if the doping of the hall sensor is lower than nominal (due to process spread), its resistance is higher and its magnetic sensitivity is larger than nominal. Then, if a nominal current is supplied to the sensor 110, its supply voltage may be too large and, as a result, its magnetic sensitivity may also be too large.

Figure 2:
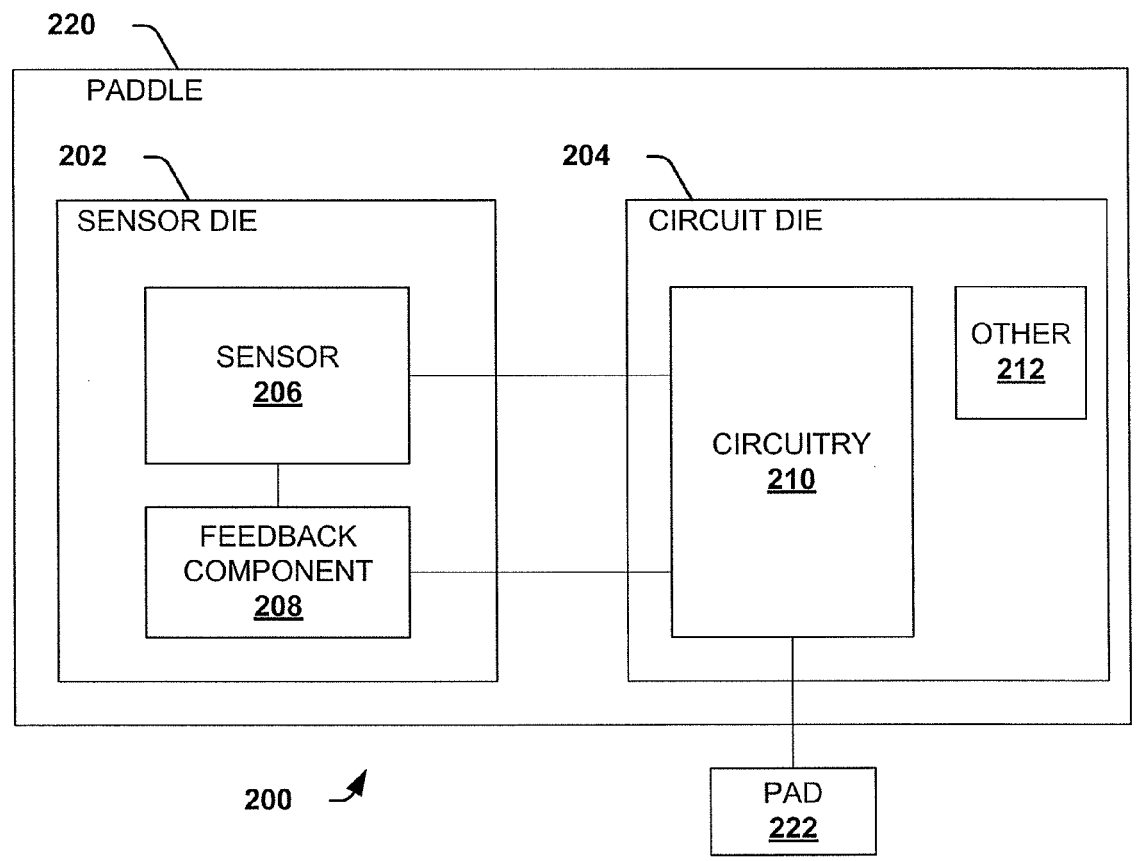
FIG. 2 is a top view of a sensor device in accordance with an embodiment of the invention.

FIG. 2 is a top view of a sensor device 200 in accordance with an embodiment of the invention. The sensor device 200 includes a die paddle 220, a sensor die 202, a circuit die 204 and a lead or bonding pad 222. The device 200 is provided and described in a simplified form to aid understanding.

Semiconductor dies are created from semiconductor wafers, which are typically created from semiconductor crystals. Typically, a number of dies are created from a single wafer by performing semiconductor fabrication processes. These processes include multi sequence steps of photolithographic and chemical processing steps wherein electronic circuits are created or formed on the wafer. Once the circuits are complete, the individual devices, referred to as dies are separated and then packaged.

The packaging included bonding or wiring the circuits on one or more dies to package leads. Once packaged, the device can be incorporated into electronic devices and the like. The packaged device can also be referred to as an integrated circuit.

Individual dies can have variations between each other. These variations can significantly impact how the devices operate. Process variations are process related variations that result from slight variations in fabrication processes. For example, a similar doping step could be performed for different dies at slightly different temperatures and result in varied performance. Semiconductor variations are semiconductor substrate or material related variations that result from varied materials, layers, or crystal orientations. For example, similar process steps on a silicon substrate based die and a GaAs substrate based die can yield varied performance. Operating condition variations include environmental based variations resulting from variations in the operating conditions or environment. In one example, one die is at a higher temperature than another, causing varied performance. Technology variations include process variations, semiconductor variations, and operating condition variations.

The sensor die 202 includes a sensor 206 and a feedback component 208. The circuit die 204 includes circuitry 210 and other circuitry 212. One or more wire or lead connection is shown connecting the sensor die 202 to the circuit die 204. More specifically, a wire is shown connecting the sensor 206 to the circuitry 210 and another wire is shown connecting the feedback component 208 to the circuitry 210. Additionally, a wire is shown connecting the circuitry 210 to the lead pad 222. The sensor 206 and the feedback component 208 are coupled in that they share similar conditions such as fabrication processes, temperate, mechanical stress spread, and the like.

Correlation information is shared or communicated between the feedback component 208 and the circuitry 210. To aid understanding, the below description is described with the feedback component 208 providing the correlation information to the circuitry 210. However, it is appreciated that variations in accordance with the invention are contemplated wherein the circuitry 210 provides the correlation information to the feedback component 208.

The feedback component 208 can communicate correlation on several correlations or conditions simultaneously. Alternatively, the feedback component 208 can comprise a plurality of individual feedback components that obtain one or more correlations each.

The circuit die 204 and the sensor die 202 have varied substrate compositions, structure, manufacturing processes, wafer size or some other variation. They can vary by utilizing different materials, layers, epitaxial layers, crystal orientations, and the like. In one example, the circuit die 204 utilizes a semiconductor substrate comprised of silicon (Si) having a crystal structure of (100) and the sensor die 202 utilizes a substrate comprised of a type III/V material. In another example, the sensor die 202 is comprised of a varied material from the circuit die 204, such GaAs, InSb, Gallium-Nitride (GaN), Indium-Arsenide (InAs) and the like. In yet another example, both dies 202 and 204 are comprised of silicon, but have varied crystal orientations including (100) commonly used for silicon, (111) advantageous for piezo-resistive sensors or surface micro-machined devices. In another example, both dies are comprised of the same material and same orientation, but one is fabricated via a CMOS process and the other a BiCMOS process with epitaxial layer.

It may also be that the dies 202 and 204 are varied in that they are made from different sized wafers, such as 4 and 8 inch wafers. In another example, the dies 202 and 204 vary in the feature sized used for each, such as a coarse technology with 1.5 µm feature size and a fine technology with 200 nm feature size. The sensor 206 provides measurements or indicators relevant to some physical property. The sensor 206 can measure, for example, magnetic fields, temperature, pressure, movement, and the like. In one example, the sensor 206 is a hall effect sensor and has a signal to noise ratio dependent on the composition of the substrate of the sensor die 202. The sensor 206 receives a supply power in the form of a current or voltage and provides a measurement signal.

The feedback component 208 provides a feedback signal that can be utilized by other components. The feedback signal provides correlation information that can be utilized to correlate spreads or variations between the dies 202 and 204. The correlation information includes, for example, temperature, resistance, capacitance, other passive component measurements, mechanical stress, pressure sensitivity, mechanical stress changes, sensitivity of a hall sensor, current gain of MOS transistors, saturation current of bipolar transistors, and the like.

The circuitry 210 controls operation of the sensor 206. The circuitry 210 provides the supply power to the sensor 206 and receives the measurement signal from the sensor 206. The circuitry 210 can also provide other functions, such as signal conditioning, power amplification, signaling, and the like. The circuitry 210 also receives the feedback signal from the feedback component 208 of the sensor die 202. In another example, the circuitry 210 provides the feedback signal to the feedback component 208. The feedback signal provides technology spread or correlation information to the circuitry 210. The circuitry 210 adjusts or alters the supply power and/or interprets the measurement signal according to the feedback signal. Thus, the supply power is compensated based on the correlation information.

In one example, the feedback signal indicates a temperature of the sensor die 202. The temperature information is utilized to alter the supply power provided to the sensor 206. In another example, the feedback signal indicates a resistance value of the sensor die 202. The resistance information is utilized to alter the supply power provided to the sensor 206 and to interpret the measurement signal. In yet another example, the sensor 206 itself provides the feedback signal and a separate feedback component is omitted.

The other circuitry 212 is also present on the circuit die 204 in this example. The other circuitry 212 is circuitry not directly related to the sensor 206. The other circuitry 212 can include, for example, memory components, communication circuitry, and the like.

In one example, the sensor die 202 utilizes a Gallium Arsenide (GaAs) substrate and includes the sensor 206. GaAs is a compound of the elements gallium and arsenic. It is a III/V semiconductor. GaAs tends to have higher saturated electron velocity and higher electron mobility, allowing transistors formed therein to operate at higher frequencies (e.g., in excess of 250 Ghz) than silicon based devices. Further, GaAs devices are less sensitive to heat and tend to have less noise, especially at higher frequencies. However, GaAs and GaAs devices formed therein are generally more costly than silicon based semiconductor devices.

The sensor 206 has a relatively higher signal to noise ratio by being implemented in GaAs, when compared with silicon based hall sensors. Using a silicon substrate for the circuit die 204 provides a relatively low cost substrate and fabrication cost for circuitry formed thereon. This is due to the large availability of silicon. Additionally, the silicon substrate provides a proven and tested substrate material having a relatively high reliability.

As shown above, utilizing varied die substrates for the sensor die 202 and the circuit die 204 provides some cost and performance advantages. However, the varied die substrates can introduce uncorrelated variations in performance, referred to as spread variations. The use of the feedback component 208 provides correlation information in the form of a feedback signal. This correlation information can then be utilized to mitigate the spread variations by compensating supply power, output signals, and the like.

It is noted that device 200 is described as a sensor device. However, it is appreciated that the present invention includes other types of devices beyond sensor devices wherein separate dies are utilized and a feedback component is employed to mitigate spread variations.

Figure 3:
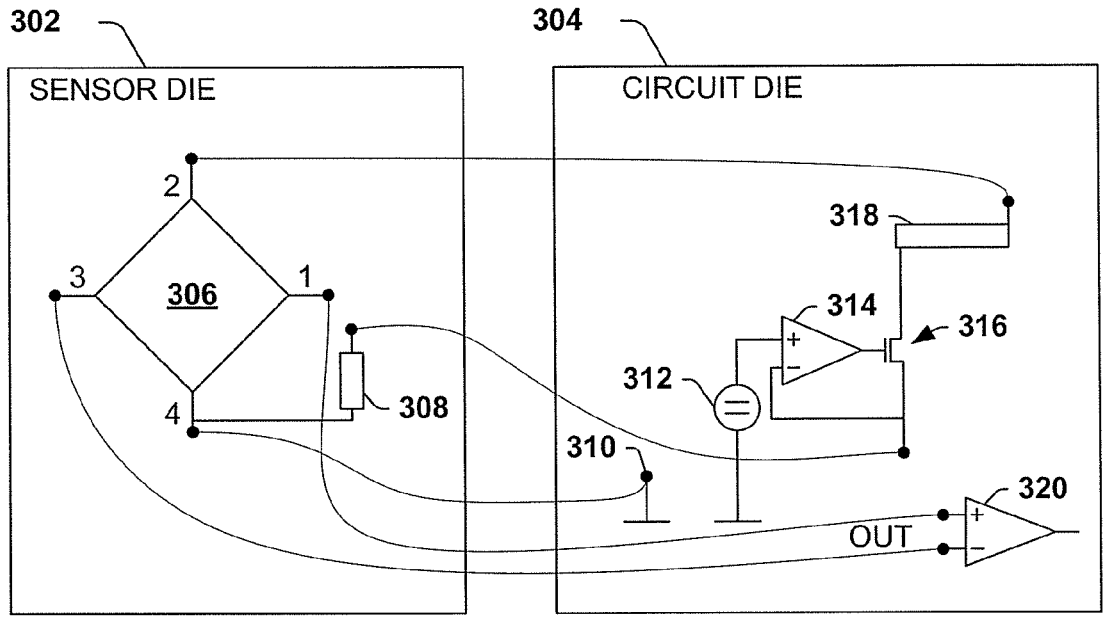
FIG. 3 is a diagram illustrating a sensor device in accordance with an embodiment of the invention.

FIG. 3 is a diagram illustrating a sensor device 300 in accordance with an embodiment of the invention. The device 300 can be implemented with a suitable packaging assembly, including, but not limited to, leadless packages, embedded wafer level packaging, very thin quad flat non-leaded (VQFN), die paddles and dies, and the like.

The sensor device 300 includes a sensor die 302, and a circuit die 304. Lead pads and a die paddle are present, but not shown for illustrative purposes. The device 300 is provided and described in a simplified form to aid understanding.

The sensor die 302 includes a sensor 306 and a feedback component 308. The circuit die 304 and the sensor die 302 have varied compositions, structure, manufacturing processes, wafer size or some other variation. For example, they can vary by utilizing different materials, layers, epitaxial layers, crystal orientations, and the like. In one example, the circuit die 304 utilizes a semiconductor substrate comprised of an organic material and the sensor die 302 utilizes a substrate comprised of a type III/V material, such as described above.

The sensor 306 provides measurements or indicators relevant to a physical property. The sensor 306 is a hall effect sensor and has a signal to noise ratio dependent on the composition of the substrate of the sensor die 302. The sensor 306 has four ports. Ports 1 and 3 provide an output signal and ports 2 and 4 receive a supply power in the form of a current or voltage.

The feedback component 308 provides a feedback signal that can be utilized by other components. The feedback signal provides correlation information that can be utilized to correlate spreads or variations between the dies 302 and 304. The feedback component 308 is a resistor having a selected resistance value. The resistance value is selected to modify current of the supply power according to a technology spread and to provide the feedback signal. The correlation information includes resistance in this example.

The circuit die includes a ground terminal 310, a voltage source 312, an opamp 314, an NMOS transistor 316, a current mirror 318, and an output amplifier 320. The ground pin 310 is connected to port 4 of the sensor 306. The voltage source 312 is coupled to a non-inverting input of the opamp 314, which drives the NMOS transistor 316. A source of the NMOS transistor 316 is connected to an inverting input of the opamp 314, which serves as a feedback signal to the opamp 314. Additionally, the source of the transistor 316 is connected to the feedback component 308 and provides a copy of the voltage of the voltage source onto the resistor. A resulting current is produced at a drain of the transistor 316. The resulting current is provided to the current mirror 318. An output of the current mirror 318 provides a drive current to port 2 of the sensor 306.

Inputs of the output amplifier 320 receive the output signal from ports 1 and 3 of the sensor 306. The output amplifier 320 amplifies the output signal and provides the amplified signal at an output.

As stated above, the technology spread between the dies 302 and 304 can result in spread variations. The feedback component 308 impacts has current flow through the component 308 to port 4, which is connected to ground. The amount of current flowing can vary according to the technology spread on the sensor die 302. For example, a more dispersed doping can result in a higher resistance and lower flow through current. The flow through current impacts the drive current.

Figure 4:
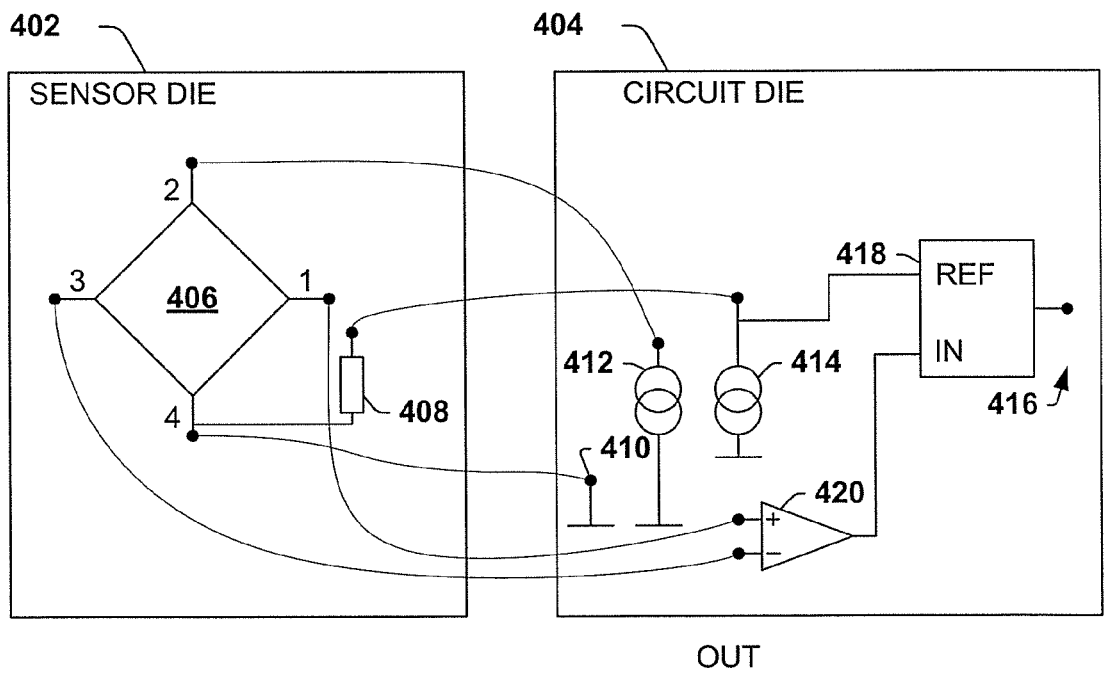
FIG. 4 is a diagram illustrating a sensor device in accordance with an embodiment of the invention.

FIG. 4 is a diagram illustrating a sensor device 400 in accordance with an embodiment of the invention. The device 300 can be implemented with a suitable packaging assembly, including, but not limited to, leadless packages, embedded wafer level packaging, very thin quad flat non-leaded (VQFN), die paddles and dies, and the like.

The sensor device 400 includes a sensor die 402, and a circuit die 404. Lead pads and a die paddle are present, but not shown for illustrative purposes. The device 400 is provided and described in a simplified form to aid understanding.

The sensor die 402 includes a sensor 406 and a feedback component 408. The circuit die 404 and the sensor die 402 have varied substrate compositions. They can vary by utilizing different materials, layers, epitaxial layers, crystal orientations, and the like. In one example, the circuit die 404 utilizes a semiconductor substrate comprised of silicon (Si) having a crystal structure of (100) and the sensor die 402 utilizes a substrate comprised of a type III/V material, such as GaAs, InSb, and the like.

The sensor 406 provides measurements or indicators relevant to a physical property. The sensor 406 is a hall effect sensor and has a signal to noise ratio dependent on the composition of the substrate of the sensor die 402. The sensor 406 has four ports. Ports 1 and 4 provide an output signal and ports 2 and 4 receive a supply power in the form of a supply current.

The feedback component 408 provides or receives a feedback signal. The feedback signal provides correlation information that can be utilized to correlate spreads or variations between the dies 402 and 404. The feedback component 408, in this example, is a resistor having a selected resistance value. The resistance value is selected to modify current of the supply power according to a technology spread.

The circuit die 404 includes a ground terminal 410, a first current source 412, a second current source 414, a Schmitt trigger 418, an output amplifier 420, and a trigger output 416. The ground terminal 410 is connected to port 4 of the sensor 406. The ground terminal 410 provides a connection to ground. The first current source 412 provides a first current to port 2 of the sensor 406. The first current supplies power to the hall plate or hall sensor 406.

Output terminals, ports 1 and 3, of the sensor 406 provide an output signal. The output signal is received on the circuit die 404 and amplified by the amplifier 420 at an output. The amplifier 420 output is provided to an input of the trigger 418.

A second current is provided by the second current source 414. The second current is injected into the feedback component 408 on the sensor die. The resulting voltage is used as a reference voltage. The trigger 418 receives the reference voltage at another input. The trigger 418 compares the reference voltage with the sensor output signal in order to generate the output signal 416.

Here, the feedback component 408, in the form of a resistor, alters or modifies the signal conditioning of the output signal 416. For example, if the doping of the sensor die 402 is larger than nominal, the magnetic sensitivity of the sensor 406 is less than nominal and the voltage across the feedback component 408 is also less than nominal. As a result, the output signal 416 obtained by the comparison of the sensor output signal and the reference voltage includes correlation information and mitigates variations due to the technology spread between the dies 402 and 404.

FIGS. 3 and 4, shown above, provide examples of communicating and utilizing correlation information to mitigate variation due to technology spread and the like. It is appreciated that other mechanisms can be employed in accordance with the invention. Some additional examples are provided below.

In one example, bond wires from the sensor die 402 and the circuit die 404 are both connected to package leads. The bond wires being connected to the package leads can mitigate operational variations between the dies 402 and 404. For example, port 4 of the sensor 406 and the ground terminal 410 can be connected to a package ground connection. Thus, both dies 402 and 404 would have a thermal connection to the package ground connection and, thereby, mitigate thermal variations between each other.

In another example, the feedback component 408 and the sensor 406 are galvanically isolated from each other. In yet another example, additional connections between the sensor 406 and the circuit die 404 may be required. For example, the sensor 406 or the feedback component 408 can be placed in tubs, which need to be isolated by reverse biasing them against the substrate of the sensor die 402. Then, the required potential for a pn-isolation can be generated on the circuit die 404 and connected to the tubs by a bond wire. In another example, aluminum ribbons which connected die to die or die to leadframe can be utilized in place of bond wires. Additionally, wafer through holes (WTH) can be used to implement connections between dies 402 and 404.

It is appreciated that other assemblies can be utilized instead of the die and leadframe approach shown above. Other types of assemblies can be utilized including, for example, leadless packages, embedded wafer level packaging, vert thin quad flat non-leaded (VQFN), and the like.

Figure 5:
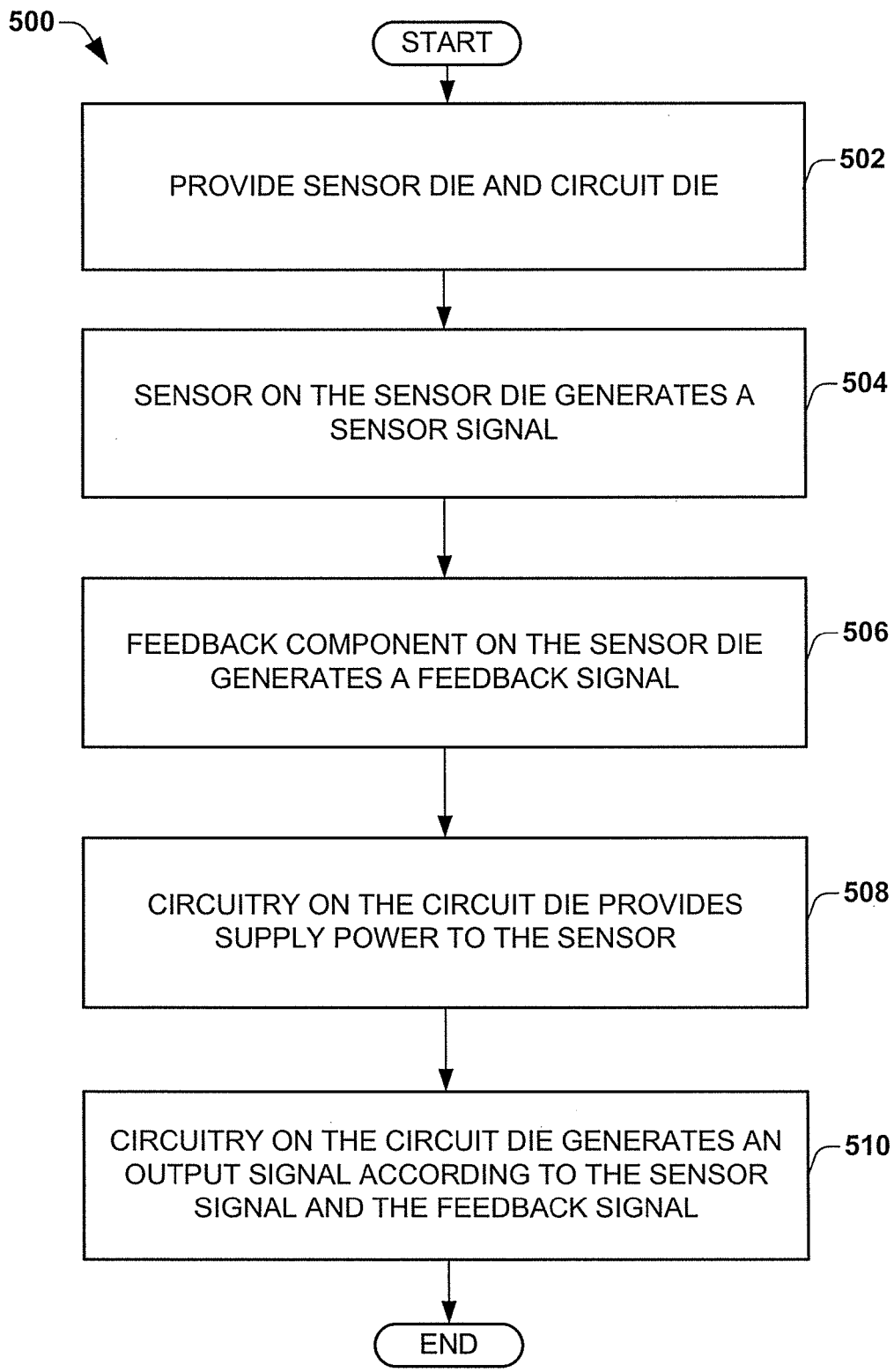
FIG. 5 is a flow diagram illustrating a method of operating a sensor device while mitigating spread variations in accordance with an embodiment of the invention.

FIG. 5 is a flow diagram illustrating a method 500 of operating a sensor device while mitigating spread variations in accordance with an embodiment of the invention. While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

The method 500 begins at block 502, where a sensor die and a circuit die are provided. The sensor die and the circuit die are varied. The sensor die is comprised of a material that facilitates devices formed thereon. Similarly, the circuit die is comprised of a material that facilitates devices formed thereon. In one example, the sensor die has a semiconductor substrate comprised of a type III/V semiconductor materials, such as GaAs and the circuit die has a semiconductor substrate comprised of silicon (100). The type III/V group semiconductor materials can facilitate sensor operation for some sensors and provide a lower signal to noise ration than other substrate materials, such as silicon. The silicon substrate material works well for general circuitry and has a relatively low cost.

A sensor located on the sensor die generates a sensor signal at block 504. The sensor measures a property, such as magnetic field, pressure, temperature and the like. The sensor is located and fabricated on the sensor die so as to facilitate operation properties of the sensor, such as speed, signal to noise, and the like. The sensor signal conveys measurement information based on one or more measured properties. In one example, the sensor is a hall effect sensor for measuring magnetic fields. In another example, the sensor is a thermistor for measuring temperature.

A feedback component generates a feedback signal at block 506. The feedback component is located on the sensor die. As a result, the feedback component shares process and/or substrate materials with the sensor. Thus, the technology spread between the feedback component and the sensor is mitigated by their location on the same die, the sensor die. Further, the feedback component has properties or obtains measurements indicating technology or spread properties related to the processing, materials, and/or operating conditions. Thus, the feedback component generates the feedback signal to provide correlation information related to the technology properties.

Circuitry located on the circuit die provides a supply power to the sensor at block 508. The circuitry performs a variety of functions such as, signal conditioning, signal amplification, power conditioning, and the like. It is also appreciated that other circuitry can be present on the circuit die. The circuit die is varied from the sensor die, thus the circuitry has varied technology conditions or spread from the sensor on the sensor die.

Additionally, the circuitry can utilize correlation information to adjust or alter the provided supply power to the sensor. The correlation information can be derived from the feedback signal or another mechanism. For example, the circuitry could increase the drive current based on the correlation information indicating that there is a temperature spread between the sensor die and the circuit die.

The circuitry located on the circuit die generates an output signal according to the sensor signal and the feedback signal at block 510. The output signal can be utilized by other components and typically represents a measurement of one or more properties by the sensor. The circuitry can condition or modify the output signal based on the feedback signal. As shown above, the feedback signal includes correlation information. Thus, the circuitry generates the output signal utilizing the correlation information.

It is noted that method 500 describes the correlation information being transferred to the circuitry via the feedback signal. It is appreciated that alternate methods include utilizing a feedback signal generated by the circuitry that includes correlation information, which is then utilized by the sensor to generate the sensor signal.

One embodiment of the present invention relates to a device, such as a sensor device. The device includes a sensor die and a circuit die. The sensor die includes a sensor and a feedback component. The circuit die includes circuitry. The circuit die is varied from the sensor die, such as comprising a varied substrate material. The circuitry is coupled to the sensor and the feedback component. The circuitry and the feedback component can communicate correlation information. The correlation information indicates technology spreads or variations between the components and/or the circuit die and the sensor die.

Another embodiment of the invention relates to a sensor device. The device includes a sensor, a feedback component, power circuitry and an output component. The sensor is located on a sensor die. The sensor includes a power input and a sensor output. The sensor is configured to provide or generate a sensor output signal at the sensor output. The feedback component is also located on the sensor die. The feedback component is coupled to the sensor. In an alternate embodiment, the feedback component is not coupled to the sensor. The power circuitry is located on a circuit die. The circuit die is varied from the sensor die. In one variation, the circuit die has a silicon substrate and the sensor die has a GaAs substrate. The power circuitry provides supply power to the power input of the sensor. Additionally, the power circuitry obtains correlation information from the feedback component. The correlation information provides or indicates technology spread between the sensor die and the circuit die. The power circuitry can provide or alter the supply power according to the correlation information to mitigate device operation variations. The output component is also located on the circuit die. The output component is configured to amplify the sensor output from the sensor. In one variation, the output component utilizes the correlation information to condition the sensor output.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the circuits or systems shown in FIGS. 2-4, etc., are non-limiting examples of circuits or devices that may be used to implement method t00). The term "article of manufacture" as used herein is intended to encompass a computer program accessible from any computer-readable device, carrier, or media. Those skilled in the art will recognize many modifications may be made to this configuration without departing from the scope or spirit of the claimed subject matter.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A sensor device comprising:
    a sensor die having a sensor and a feedback component, the feedback component configured to generate correlation information within a feedback signal and the sensor configured to generate a sensor signal; and
    a circuit die having circuitry, the circuit die being distinct and separate from the sensor die and the circuitry configured to generate supply power for the sensor based on the correlation information and to generate an output signal from the sensor signal according to the feedback signal; and
    wherein the circuitry is coupled to the sensor and the feedback component.

2. The device of claim 1, wherein the sensor die is comprised of silicon and the circuit die is comprised of a type III/V material.

3. The device of claim 2, wherein the type III/V material is GaAs.

4. The device of claim 2, wherein the silicon has a crystal structure of (100).

5. The device of claim 1, wherein the sensor is a hall effect sensor that provides the sensor signal to the circuitry, wherein the circuitry is configured to perform signal conditioning on the sensor output signal.

6. The device of claim 1, wherein the feedback component is a resistor.

7. The device of claim 1, wherein the feedback component is a thermistor.

8. The device of claim 1, further comprising a die paddle onto which the sensor die and the circuit die are affixed.

9. The device of claim 8, further comprising a package lead coupled to the circuitry.

10. A sensor device comprising:
    a sensor located on a sensor die, the sensor having a power input and a sensor output, wherein the sensor is configured to provide a sensor output signal at the sensor output;
    a feedback component located on the sensor die and coupled to the sensor, wherein the feedback component is configured to generate correlation information within a feedback signal;
    power circuitry located on a circuit die, the circuit die being distinct and separate from the sensor die and the power circuitry configured to generate supply power to the power input of the sensor based on the correlation information from the feedback component; and
    an output component located on the circuit die, the output component configured to generate an output signal from the sensor output according to the feedback signal.

11. The device of claim 10, wherein the sensor is a pressure sensor and provides a pressure signal as the sensor output signal.

12. The device of claim 10, wherein the sensor is a hall effect sensor and provides a magnetic field measurement signal as the sensor output signal.

13. The device of claim 10, wherein the power circuitry provides a copy of a voltage source to the feedback component.

14. The device of claim 10, wherein the power circuitry utilizes an output of the feedback component as a reference voltage.

15. A method of operating a sensor device, the method comprising:
    providing a sensor die and a circuit die, the sensor die and the circuit die being distinct and separate from each other;
    generating a sensor signal by a sensor located on the sensor die;
    generating a feedback signal by a feedback component located on the sensor die, the feedback signal comprising correlation information;
    generating a supply power to the sensor according to the correlation information by circuitry located on the circuit die;
    generating an output signal by the circuitry on the circuit die by interpreting the sensor signal according to the feedback signal.

16. The method of claim 15, further comprising modifying the supply power according to the correlation information.

17. The method of claim 15, further comprising mitigating thermal variations between the sensor die and the circuit die by connecting bonding wires from the sensor die and the circuit die to package leads.

* * * * *